(12) United States Patent
Koren et al.

(10) Patent No.: US 8,324,953 B1
(45) Date of Patent: Dec. 4, 2012

(54) METHOD AND A SYSTEM FOR SIGNAL PROCESSING

(75) Inventors: Doron Shahar Koren, Rishon le Zion (IL); Sergey Toujikov, Rishon le Zion (IL)

(73) Assignee: Vyycore Ltd., Petah Tikva (IL)

( * ) Notice: Subject to any disclaimer, the term of this patent is extended or adjusted under 35 U.S.C. 154(b) by 514 days.

(21) Appl. No.: 12/582,744

(22) Filed: Oct. 21, 2009

(51) Int. Cl.
*H03K 5/08* (2006.01)
(52) U.S. Cl. ............ 327/318; 327/309; 327/180
(58) Field of Classification Search .......... 327/309–312, 327/180, 318
See application file for complete search history.

(56) References Cited

U.S. PATENT DOCUMENTS

2003/0098805 A1* 5/2003 Bizjak ...................... 341/139
2009/0285194 A1* 11/2009 Kim et al. .................. 370/342

* cited by examiner

*Primary Examiner* — Lincoln Donovan
*Assistant Examiner* — Shikha Goyal
(74) *Attorney, Agent, or Firm* — Reches Patents

(57) ABSTRACT

A system for processing an input signal, the system including: (a) a hardware memory module configured to store a lookup table; and (b) a signal processing module, configured to clip the input signal to provide a second signal that does not exceed a magnitude threshold, wherein the signal processing module is configured to clip the input signal by processing the input signal using at least one filtering parameter that is retrieved from the lookup table using at least one lookup table index which is selected in response to the input signal.

20 Claims, 6 Drawing Sheets

METHOD AND A SYSTEM FOR SIGNAL PROCESSING

BACKGROUND OF THE INVENTION

In the recent years new set of standard for wireless communication such as WCDMA and OFDM has been introduced. This set of standard provide better spectral efficiency. However, this standards side effect is a high peek to average signals (PAR) sometime more then 10 dB. In this new standard the likelihood for a peek to occur is very low, (Usually 1xE-4 to 1xE-5).

Although those peek signals are rare, when they passing through a power amplifier they create enormous spurious emissions, both in band, and out of band. Those inter-modulations are caused by the thermal memory effect of a power amplifier. That is why the need to digital clipping has been born. Digital clipping is a mechanism that clip a rare high amplitude signals. However a direct implementation clipping will result in a spectral re-growth.

FIG. 1 illustrates a prior art system for hard clipping a signal. As could be seen, such a prior art system determines whether the input signal exceeds a given threshold (e.g. by a comparator that is configured to compare two signals), and if so—generates a correction signal which is subtracted from the input signal. If the input signal is lower than the threshold, the correction signal is zero. However, such system is not capable of soft clipping the signal, and results in many distortions to the signal.

A prior art system is known, that reduce peak to average power ratios during transmission. The Peak to average power ratios are reduced by selecting a subset of a plurality of frequencies that make up a multi-carrier symbol. Peak reduction signals, carried at the subset of frequencies, are computed to reduce the PAR of the symbol.

Another prior art technique is known for reducing peak to average power ratio (PAR) in single and multi-carrier transmitters while accounting for the effect of the transmit filters without significantly affecting a requisite transmission Power Spectral Density (PSD) mask.

Another prior art system is known to reduce the Peak power to Average power Ratio, with Forward Error Correction (FEC) mechanism. A peak detection mechanism, a procedure for choosing a subcarrier to be modified and a symbol modifier scheme are disclosed for lowering the peak power of a signal while minimizing coding errors.

Another technique is known in the art for post filtering signal peak reduction adapted for use in a multi-carrier communication system incorporating a source of a multi-carrier communication signal band limited in plural bands corresponding to the plural carriers. A first signal path receives as an input the band limited multi-carrier communication signal. A second parallel signal path includes a peak reduction calculation circuit for calculating a peak reduction correction signal and a plurality of filters providing a plurality of parallel filtering operations on the peak reduction correction signal corresponding to the plural bands to which the communication system is limited.

In another prior art system, an amplitude limiting circuit for limiting the amplitude of a signal input to a power amplifier is used, which includes an amplitude converter, determination unit, peak detector, window filter, delay circuit, and multiplier. The amplitude converter calculates the amplitude value of an input signal.

Another known proposed technique was to clip the base band signals and then filter it to prevent the spectral re-growth. However this method suffer from two drawbacks; It take tremendous amount of silicon resources (gate count) to produce a sharp slope filter (or massive DSP time), and once a sharp slope filter is applied to the Base band signal, it create ripple and group delay effect that degrade the EVM performance of the modem at low amplitude.

Therefore, effective and affordable means for applying peak to average reduction are required.

SUMMARY OF THE INVENTION

A system for processing an input signal, the system including: (a) a hardware memory module configured to store a lookup table; and (b) a signal processing module, configured to clip the input signal to provide a second signal that does not exceed a magnitude threshold, wherein the signal processing module is configured to clip the input signal by processing the input signal using at least one filtering parameter that is retrieved from the lookup table using at least one lookup table index which is selected in response to the input signal.

A method for processing an input signal, the method including: (a) selecting at least one lookup table index in response to the input signal; (b) retrieving at least one filtering parameter from a lookup table that is stored in a hardware memory module, using the at least one lookup table index; and (c) clipping the input signal to provide a second signal that does not exceed a magnitude threshold, wherein the clipping comprises processing the input signal using the at least one filtering parameter.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
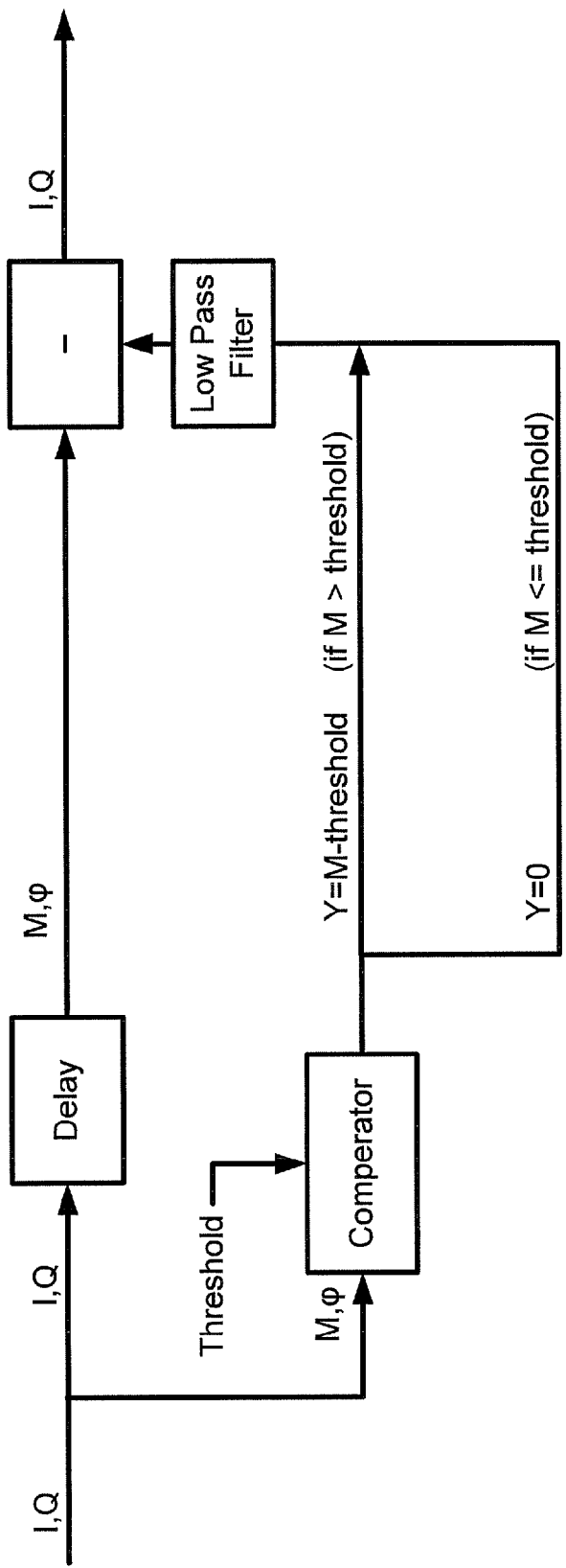
FIG. 1 illustrates a prior art system for hard clipping a signal.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Figure 2A:
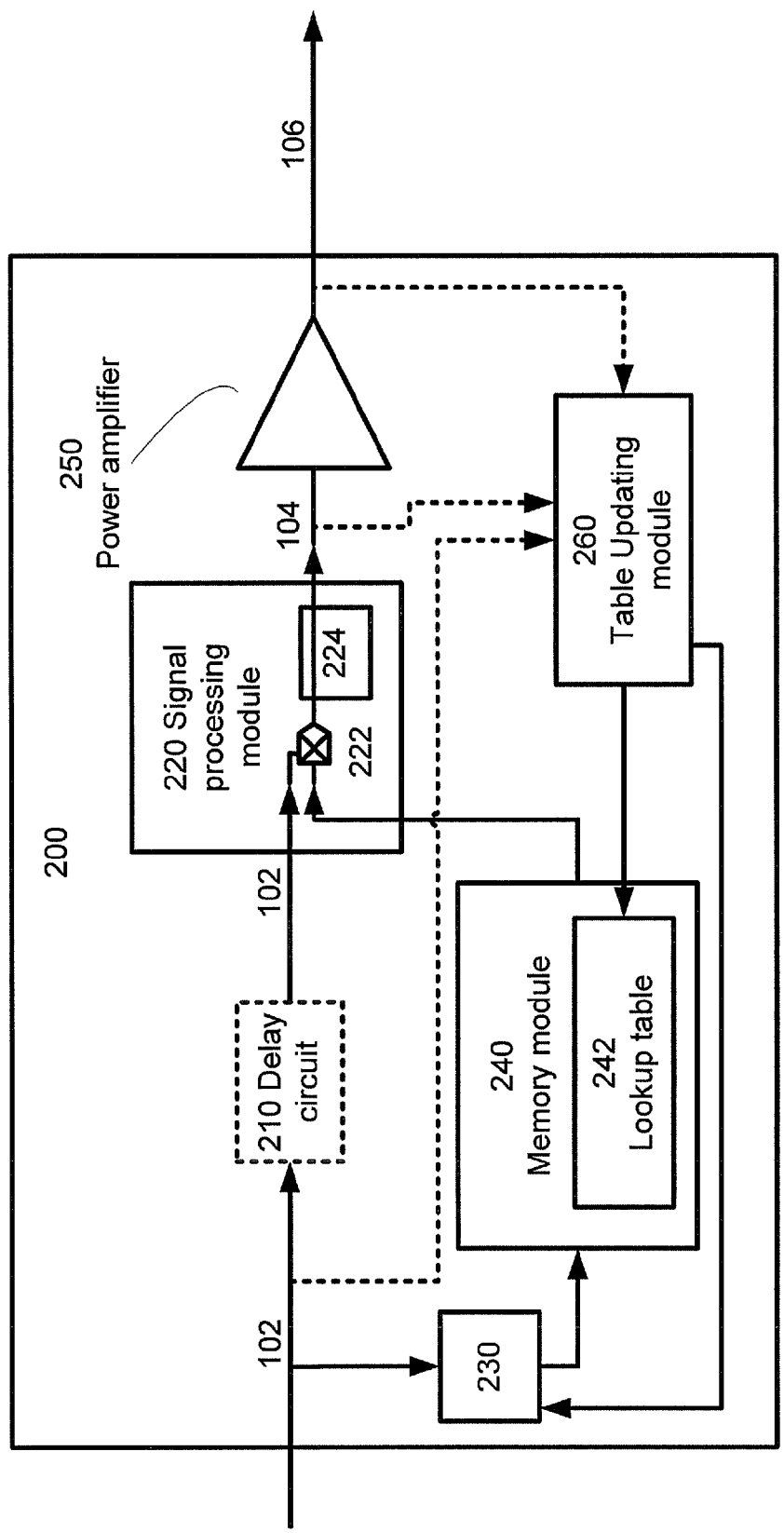
FIG. 2A illustrates a system for processing an input signal, according to an embodiment of the invention.

FIG. 2A illustrates system 200 for processing an input signal (denoted 102), according to an embodiment of the invention. System 200 may conveniently be used for clipping of signals (and potentially also of soft clipping of those signals), as well as potentially to other additional types of signal processing.

System 200 includes signal processing module 220, which is configured to clip the input signal to provide a second signal (denoted 104) that does not exceed a magnitude threshold. Signal processing module 220 is configured to clip the input signal by processing the input signal using at least one filtering parameter that is retrieved from lookup table 242 using at least one lookup table index, wherein the at least one lookup table index is selected in response to the input signal. It is noted that the at least one lookup table index may be selected either by signal processing module 220, or by another component of system 200. It is noted that signal processing module 220 may include hardware, software, and/or firmware components, and any combination thereof. It is noted that conveniently, the processing of the signal may be carried out by hardware components of signal processing module 220, such as a hardware signal multiplier.

Figure 3:
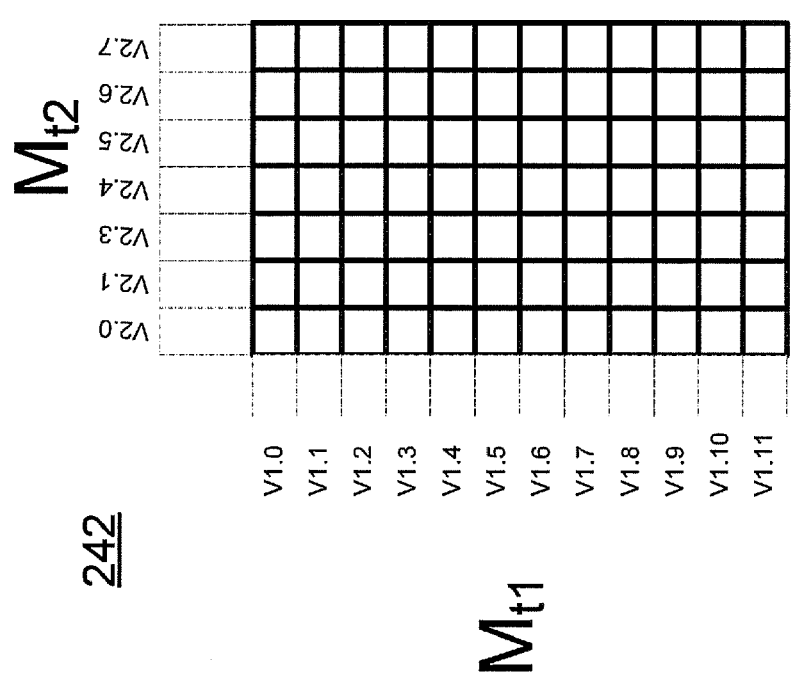
FIG. 3 illustrates a lookup table, according to an embodiment of the invention.

Hardware memory module 240 of system 200 is configured to store lookup table 242. An exemplary lookup table 242, according to an embodiment of the invention, is illustrated in FIG. 3. However, it is noted that other lookup tables may be used by system 200, according to different embodiments of which.

It is noted that the at least one lookup table index may be selected, according to an embodiment of the invention, by a selector 230 of system 200, which is configured to determine magnitudes of the input signal at different times, and to select the at least one lookup table index in response to the analysis of the input signal. According to an embodiment of the invention, selector 230 may determine other properties of the input signal, and to select the at least one lookup table indexes accordingly. According to an embodiment of the invention, selector 230 is further configured to select the at least one lookup table index in response to an analysis of the input signal, as well as to auxiliary information not pertaining to the input signal. For example, such auxiliary information may pertain to the magnitude threshold, to a state of a receiver of the second signal, and so forth.

According to an embodiment of the invention, signal processing module 220 is configured to clip the input signal only if such clipping is required—e.g. if the input signal exceeds at a given moment of time a magnitude threshold (which may be equal to the aforementioned magnitude threshold—or lower from which, if soft clipping is applied). For example, the determination whether to clip the input signal may be taken by selector 230, which analyses the input signal. According to another embodiment of the invention, such determination may be carried out by signal processing module 220.

It is further noted that the filtering parameters of lookup table 242 may be such, according to an embodiment of the invention, that some input signal values (e.g. those lower than a given threshold) will not be modified by the processing of which. By way of example, if the clipping comprises multiplying the input signal by a factor retrieved from lookup table 242, the table may include correction factors equal to "1" for relatively low input signal magnitudes, thus not modifying the input signal at such points in time. It is however noted that determining not to clip the input signal prior to the processing using the at least one filtering parameters may save, according to an embodiment of the invention, processor resources, power, and/or time.

It is noted that the second signal—which is clipped so as not to exceed the magnitude threshold—may be provided to another component of system 200 (or to an external unit/system), which requires a signal bounded by at least the magnitude threshold, or which will be more effective receiving such a signal as an input. For example, according to an embodiment of the invention, system 200 may further include power amplifier 250, which is used for amplifying the input signal—or in this case—the possibly clipped version of which. It is noted that clipping by signal processing module 220—which results in providing to power amplifying a signal of bounded magnitude—may result in amplification which is more faithful to the input signal. Also, such a clipping may protect the amplifier from undesired side effects of amplifying a signal off too high power.

According to an embodiment of the invention, signal processing module 220 is configured to clip the input signal by processing the input signal in response to the at least one filtering parameter that is retrieved from the lookup table using a first and a second lookup table indexes (and according to an embodiment of the invention, also to using a third lookup table index), wherein the first index is responsive to a magnitude of the input signal at a first moment, the second index is responsive to a magnitude of the input signal at a second moment, and the third index—if implemented—is responsive to a magnitude of the input signal at a third moment.

It is noted that many parameters may be used, according to various embodiments of the invention, as lookup table indexes. Such parameters may relate to I and Q values of the input signal, to magnitude of which, to phase of which, to phase differences in different times, and so forth. Also, other parameters may relate to other information (e.g. status of the signal processing module, and or of other components to which the second signal is provided, and so forth).

According to an embodiment of the invention, signal processing module 220 is configured to clip the input signal by processing the input signal in response to the at least one filtering parameter that is retrieved from the lookup table using the aforementioned first and second (and possibly third) lookup table indexes that are responsive to magnitudes of the input signals at different times, wherein, according to an embodiment of the invention, the first and the second (and possibly the third) moments are consecutive moments of a discrete sampling scheme. It is noted that as the input signal may conveniently be a digital signal, the magnitude of the signal is sampled in discrete sampling times (usually in a constant sampling frequency, but not necessarily so). For example, if the input signal is provided in sampling periods of $\Delta T$, than the first lookup table index may be responsive to the magnitude of the input signal at time $T_0$, the second lookup table index may be responsive to the magnitude of the input signal at time $T_0 - \Delta T$, and the third lookup table index—if implemented—may be responsive to the magnitude of the input signal at time $T_0 - 2 \cdot \Delta T$. According to another embodiment of the invention, the indexes may be responsive to magnitudes of the input signals at other timings (e.g. $T_0$, $T_0 - N \cdot \Delta T$, and possibly $T_0 - 2 \cdot N \cdot \Delta T$).

It is noted that according to different embodiments of the invention, memory module 240 is configured to store a lookup table 242 of different sizes and dimensions. The size of lookup table 242 depends on the number of lookup table indexes used for searching, the number of values each of these indexes may take, and the number and size of filtering parameters. The dimension of lookup table 242 equals the number of lookup table indexes required for retrieving each group of at least one filtering parameters.

For example, according to an embodiment of the invention, memory module 240 is configured to store a three dimensional lookup table 242. According to such an embodiment of the invention, exactly three values are required for exactly three different lookup table indexes, which are required for the retrieving of the at least one filtering parameters. Those three parameters may be the aforementioned first, second, and third lookup table indexes, but this is not necessarily so.

For example, according to an embodiment of the invention, memory module 240 is configured to store a two dimensional lookup table 242. According to such an embodiment of the invention, exactly two values are required for exactly three different lookup table indexes, which are required for the retrieving of the at least one filtering parameters. Those two parameters may be the aforementioned first and second lookup table indexes, but this is not necessarily so.

It is noted that the retrieving of the at least one filtering parameters (whether by signal processing module 220, by components thereof, or by another component of system 200) may be carried out by a retrieving module of memory module 240 (not shown), or in any other way that is known in the art.

The retrieving of the at least one filtering parameter from lookup table 242 is conveniently relatively fast and requires a relatively small amount of computational power. According to an embodiment of the invention, lookup table 242 is a three dimensional lookup table (and memory module 240 is configured to store a three dimensional lookup table), in which every group of at least one filtering parameter that is used for filtering is retrievable using three indexes, all of which are magnitude related, as discussed above.

The at least one filtering parameter which is retrieved from lookup table 242 for filtering by signal processing module 220 may consist, according to an embodiment of the invention, of a complex compensation coefficient, wherein signal processing module 220 is configured to multiply the input signal by the compensation coefficient for the generating of the second signal (e.g. by a multiplier 222). It is noted that multiplying the entire input signal by a single complex compensation coefficient (or multiplying components of the complex input signal by two real parameters, which correspond to a complex parameter) is conveniently a relatively fast and not complex way of filtering the input signal.

The at least one filtering parameter which is retrieved from lookup table 242 for filtering by signal processing module 220 may consist, according to an embodiment of the invention, of a real (or fractional) compensation coefficient, wherein signal processing module 220 is configured to multiply the input signal (and/or a magnitude of which, and/or the I and Q components of which) by the compensation coefficient for the generating of the second signal (e.g. by a multiplier 222). It is noted that multiplying the entire input signal by a single real (or fractional) compensation coefficient is conveniently a relatively fast and not complex way of filtering the input signal.

It is noted that the at least one filtering parameter may be provided to signal processor 220 as an electric signal which can be analogously used for processing the input signal using the electric signal and analogue signal processing technique. For example, electric parameters of the electric signal that is responsive to the at least one filtering parameter—e.g. amplitude, phase, magnitude—may indicate of a value of the at least one parameter. Such signal may be generated by memory module 240, or by an additional signal generating or processing module (not illustrated).

According to an embodiment of the invention, the input signal may be provided to signal processing module 220 after being delayed by a delay circuit 210 (which may include, for example, a flip-flip), e.g. so the input signal will timely reach processing when the at least one filtering parameter reaches signal processing module 220 or a sub-module of which.

As aforementioned, the first index may be responsive to a magnitude of the input signal at a first moment ($M_{t1}$), the second index may be responsive to a magnitude of the input signal at a second moment ($M_{t2}$), and the third index—if implemented—may be responsive to a magnitude of the input signal at a third moment ($M_{t3}$), wherein the magnitude may be calculated as known in the art (e.g. $M=sqrt(I^2+Q^2)$, wherein I and Q are the common representations of the complex components of the input signal).

It is noted that while more than three magnitude samples may be determined and utilized for the retrieval of the filtering parameters from a lookup table (using additional indexes, on top of the first and the second indexes), the added value of such additional samples (e.g. $M_{t4}$, $M_{t5}$) is usually not as valuable for the retrieval of efficient filtering parameters.

It is noted that beside processing the input signal in response to the at least one filtering parameter retrieved from lookup table 242, other types of processing may be applied to the signal before it is being outputted. Also, it is further noted that the filtering parameters may be used by signal processing module 220 for other filtering purposes than the cropping of the input signal.

For example, the signal transmitted may be converted from a digital signal to an analogue signal, by upconverting the signal, low-pass filtering, and other filtering, processing and manipulating techniques that are known in the art. The input signal may also be pre-distorted, so to overcome non-linearities of components/units/system that receives the second signal, such as power amplifier 250.

Such additional filtering may be carried out, according to an embodiment of the invention, by one or more filtering modules 224. It is noted that the filtering may compensate for non-linearity (or other imperfections) of such components as well, and not only of power amplifier 250 itself.

FIG. 3 illustrates lookup table 242, according to an embodiment of the invention. It is noted that the number of first indexes may differ from that second indices, and so on. According to an embodiment of the invention, the size of the lookup table is 16×32 (not as illustrated). It will be clear to a person who is skilled in the art that lookup table of various sizes may be implemented in different embodiments of the invention, and that is some embodiments of the invention the size of the look-up table may even change at different times (e.g. determining to use a limited size look-up table when power consumption should be low, when results need not be very accurate, and so forth). The dimensions of the look-up table may be 2 raised to various integer powers (e.g. 4, 8, 16, 32, 64, etc.), but this is not necessarily so.

It is noted that the indexes may be organized in equal intervals (e.g. multiples $n \cdot M_0$ of a given magnitude value $M_o$ for a given set of consecutive integer n's), but this is not necessarily so.

Since only a finite (and possibly relatively small) number of indexes is used for each of the parameters, according to an embodiment of the invention signal processing module 220 is configured to process the input signal in response to at least one interpolated value that is determined in response to at least one filtering parameter and to at least one other filtering parameter, wherein the at least one other filtering parameter is retrieved from the lookup table using at least one lookup table index that is different from the first and the second (and possibly the third, if implemented) lookup table indexes, and which is responsive to a parameter selected from a list consisting of the magnitude of the input signal at the first moment and the magnitude of the input signal at the second moment (and if implemented, also of the magnitude of the input signal at the third moment).

Referring again to FIG. 2A and to system 200, it is noted that signal processing module 220 may not always process the input signal in response to the at least one filtering parameter (or, it may process it in a trivial way such as multiplying it by a unit so as to keep it the same). Preventing of such processing in some of the cases (or enabling a simple trivial processing which does not substantially modify the input signal) may facilitate the amplification, reduce computational power, and may even reduce the number of interferences with the input signal, thus increasing a quality of the amplification.

For example, if the input signal is determined (by signal processing module 220 or a preceded module) to be of electrical parameters in which no cropping is required, processing may not be required.

According to an embodiment of the invention, signal processing module 220 (or another component of system 200) is further configured to determine in response to the input signal whether to crop or to otherwise process the input signal, signal processing module 220 is further configured to selectively process the input signal in response to a result of the determining.

The processing of the signal by signal processing module 220 is usually a continuous operation, in which in different times (and possibly at a rate that is equal to the sampling rate of the digital input signal) different filtering parameters are retrieved from lookup table 242, and used to process samples of the input signal at different times.

It is noted that the filtering parameters stored in lookup table 242 may be updated from time to time, either during operation (continuous filtering of an input signal)—possibly as result of the operation—or in an "off-line" manner.

According to an embodiment of the invention, system 200 includes table updating module 260 for updating one or more filtering parameters stored in lookup table 242. It is noted that according to an embodiment of the invention table updating module 260 may be a part of a filter updating module that control other parameters of signal processing module 220, e.g. a threshold for determining that processing of the input signal is required.

For example, according to an embodiment of the invention, table updating module 260 may update one or more filtering parameters stored in lookup table 242 (which may also be referred to as the table coefficients). According to an embodiment of the invention, table updating module 260 may update one or more magnitude values used by selector 230.

According to an embodiment of the invention, table updating module 260 is configured to update at least one filtering parameter of the lookup table in response to the amplified signal. According to such an embodiment of the invention, table updating module 260 may conveniently be configured to compare the second signal (or a signal which results from which, e.g. an amplified signal) to the input signal. The updating by table updating module 260 conveniently includes updating a lookup table entry (one or more filtering parameters) that corresponds to the input signal. It is noted that the comparison may pertain to a processed version of any of the above mentioned signal—e.g. a down-converted output signal, and so forth.

According to an embodiment of the invention, table updating module 260 is configured to update lookup table 242 in response to a physical condition of one or more components of system 200, and/or of auxiliary units/systems. For example, in different input signal type (Wi-Fi/WiMAX/WCDMA etc), input signal peak to average, output signal power, different filtering parameters may be used. Such updating may include retrieving data from other parts of memory module 240 (which may and may not have slower access times).

It is noted that the filtering parameters of lookup table 242 may be determined so as to bring the operation of signal processing module 220 closer to that of a known filter (e.g. an external clipping circuit, which may utilize more complex processing scheme). According to an embodiment of the invention, table updating module 260 is configured to write to lookup table 242 at least one filtering parameter that is determined by minimizing a difference between a signal processed using lookup table 242 (conveniently by signal processing module 220, but not necessarily as this process may be carried out off line) and a signal processed using another filter.

It is noted that the different aforementioned functionalities discussed in relation to table updating module 260 may be implemented using one or more filter updating modules, which may be a part of system 200, or external to it.

According to an embodiment of the invention, signal processing module 220 may utilize the at least one filtering parameter retrieved from lookup table 242, for soft clipping the input signal. In soft clipping, the cutting off of the signal is not round-edged, but rather soft edges are applied towards the clipping. That is, in magnitudes of the input signal which approaches the magnitude threshold (though do not cross it yet), some reduction is applied (e.g. by multiplying the input signal by correction factors that are slightly smaller than 1), so as to reduce the hard-edges which characterize hard clipping, and so to limit the frequencies distortion characterizing of hard clipping.

According to an embodiment of the invention, signal processing module 220 is configured to clip only certain frequencies of the input signal (depending on the at least one filtering parameters retrieved from lookup table 242).

Figure 2B:
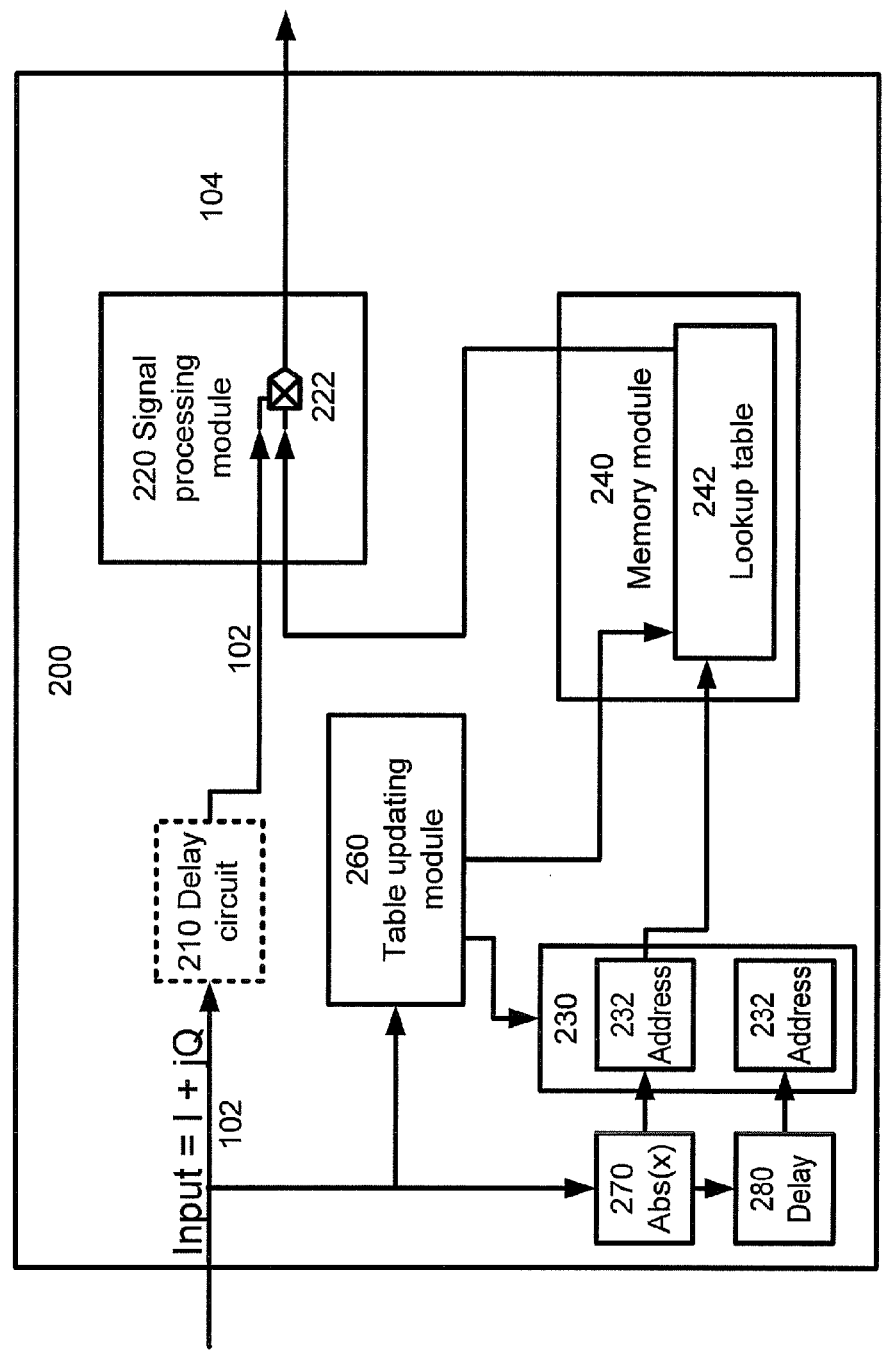
FIG. 2B illustrates a system for processing the input signal, according to an embodiment of the invention.

FIG. 2B illustrates system 200 for processing the input signal, according to an embodiment of the invention.

The input signal 102 is conveniently complex, and contain the in phase and quadrate phase signals (I,Q). According to an embodiment of the invention, system 200 includes at least one absolute value calculation module 270 (which may and may not be a part of a selector 230) which is configured to calculate the absolute value of the input signal at different times. The output of absolute value calculation module 270 is the magnitude of the input vector (a real number). The output of absolute value calculation module 270 may be fed, according to an embodiment of the invention, to an address generator 232 (which may and may not be a part of a selector 230), that is configured to select an address of the lookup table. The output of block address generator 232 may represent, according to an embodiment of the invention, a partial-address bus correspond with the input vector magnitude generated by absolute value calculation module 270. address generator 232 can be implemented, according to an embodiment of the invention, as a simple look up table (LUT) that represent a logarithmic results of the input, and may return, according to an embodiment of the invention, the most significant bits of the output of absolute value calculation module 270, or any other mathematical function.

The absolute value of the input signal (which may be determined by absolute value calculation module 270) may also be fed to one or more delay circuits (or delay memory) 280, and then to be fed—after a delay by the corresponding delay circuit—into one or more other address generators 232.

According to an embodiment of the invention, the delay circuits may be a simple memory delay to compensate for the delay in the path of look up table 242.

According to an embodiment of the invention, an address bus of lookup table 242 may include the busses generated by the address generators 232. The output of lookup table 242 may be fed, according to an embodiment of the invention, into multiplier 222 which multiply the delayed input signals and the output of the lookup table. The output result—the second signal—may conveniently be a soft clipped signals with a lower peek to average signals.

Figure 4:
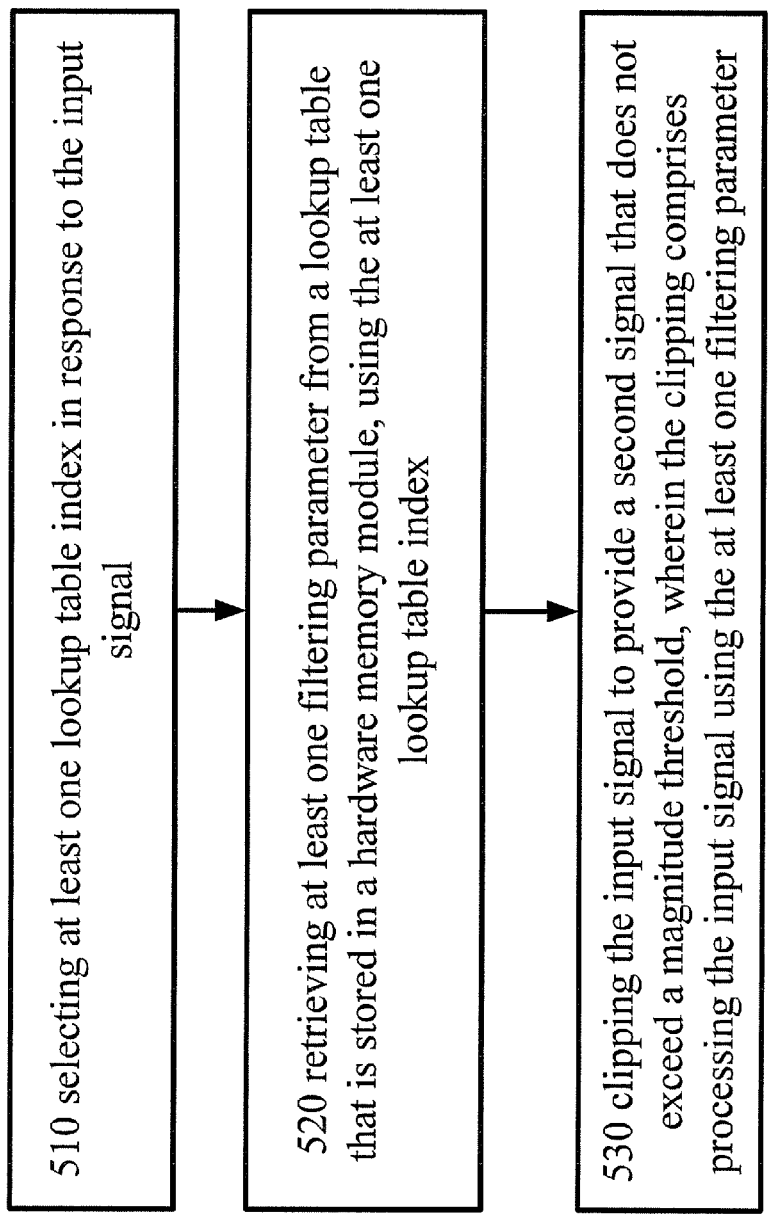
FIG. 4 illustrates a method for processing an input signal using, according to an embodiment of the invention.

FIG. 4 illustrates method 500 for processing an input signal using, according to an embodiment of the invention.

Method 500 may start with stage 510 of selecting at least one lookup table index in response to the input signal. The selecting is conveniently carried out in response to an analyzing of the input signal—e.g. determining the magnitude of the input signal at different times.

According to an embodiment of the invention, the selecting may include selecting a first lookup table index in response to a magnitude of the input signal at a first moment, and selecting a second lookup table index in response to a magnitude of the input signal at a second moment. According to an embodiment of the invention, the selecting may further include a third lookup table index in response to a magnitude of the input signal at a third moment. According to an embodiment of the invention, no other lookup table indexes are selected apart from the first and the second (and potentially also the third, if implemented) lookup table indexes.

It is noted that, according to an embodiment of the invention, the first and the second moments (and potentially also the third, if implemented) are consecutive moments of a discrete sampling scheme.

Stage 520 of method 500 includes retrieving at least one filtering parameter from a lookup table that is stored in a hardware memory module, using the at least one lookup table index.

According to an embodiment of the invention, the retrieving may include retrieving the at least one filtering parameter from the lookup table using only the first and the second (and potentially also the third, if implemented) lookup table indexes.

It is noted that different filtering parameters may be utilized (and this stored in the lookup table), according to different embodiments of the invention. According to an embodiment of the invention, the retrieving includes retrieving the at least one filtering parameter that consists of a complex compensation coefficient. According to another embodiment of the invention, the retrieving includes retrieving the at least one filtering parameter that consists of a real (or fractional) compensation coefficient.

According to an embodiment of the invention, the retrieving includes retrieving the at least one filtering parameter from a two dimensional lookup table.

According to an embodiment of the invention, the retrieving may include retrieving the at least one other filtering parameter from the lookup table using at least one lookup table index that is different from the first and the second lookup table indexes, and which is responsive to a magnitude of the input signal at one of the first and the second moments It should be noted that, according to an embodiment of the invention, the retrieving may be preceded by determining at least one filtering parameter of the lookup table by minimizing a difference between a signal clipped using the lookup table and a signal clipped using another filter. It is noted that other techniques may be used for filling in and/or for updating the data stored in the lookup table. While several such methods are disclosed, it is noted that other techniques—some of which are known in the art—may also be used.

Stage 530 of method 500 includes clipping the input signal to provide a second signal that does not exceed a magnitude threshold, wherein the clipping includes processing the input signal using the at least one filtering parameter.

According to an embodiment of the invention, the clipping may include multiplying the input signal by the compensation coefficient.

According to an embodiment of the invention, the clipping is preceded by determining in response to the input signal whether to clip the input signal, wherein the clipping is selectively carried out in response to a result of the determining.

According to an embodiment of the invention, the clipping may include processing the input signal in response to at least one interpolated value that is determined in response to at least one filtering parameter and to at least one other filtering parameter;

According to an embodiment of the invention, method 500 may further include a stage of updating at least one filtering parameter of the lookup table in response to the second signal. According to an embodiment of the invention, method 500 may further include a stage of updating magnitude values which are used in stage 510 of selecting.

It is noted that method 500 may conveniently be carried out by a system such as system 200. Referring to the examples set forth in the previous drawings, the retrieving may be carried out by memory unit 240, by signal processing module 220, or by a dedicated unit, the processing may be carried out by signal processing module 220, and the selecting may be carried out by selector 230. It is noted that different embodiments of system 200 may be implemented by corresponding embodiments of method 500, even if not explicitly elaborated, and vice versa.

Figure 5:
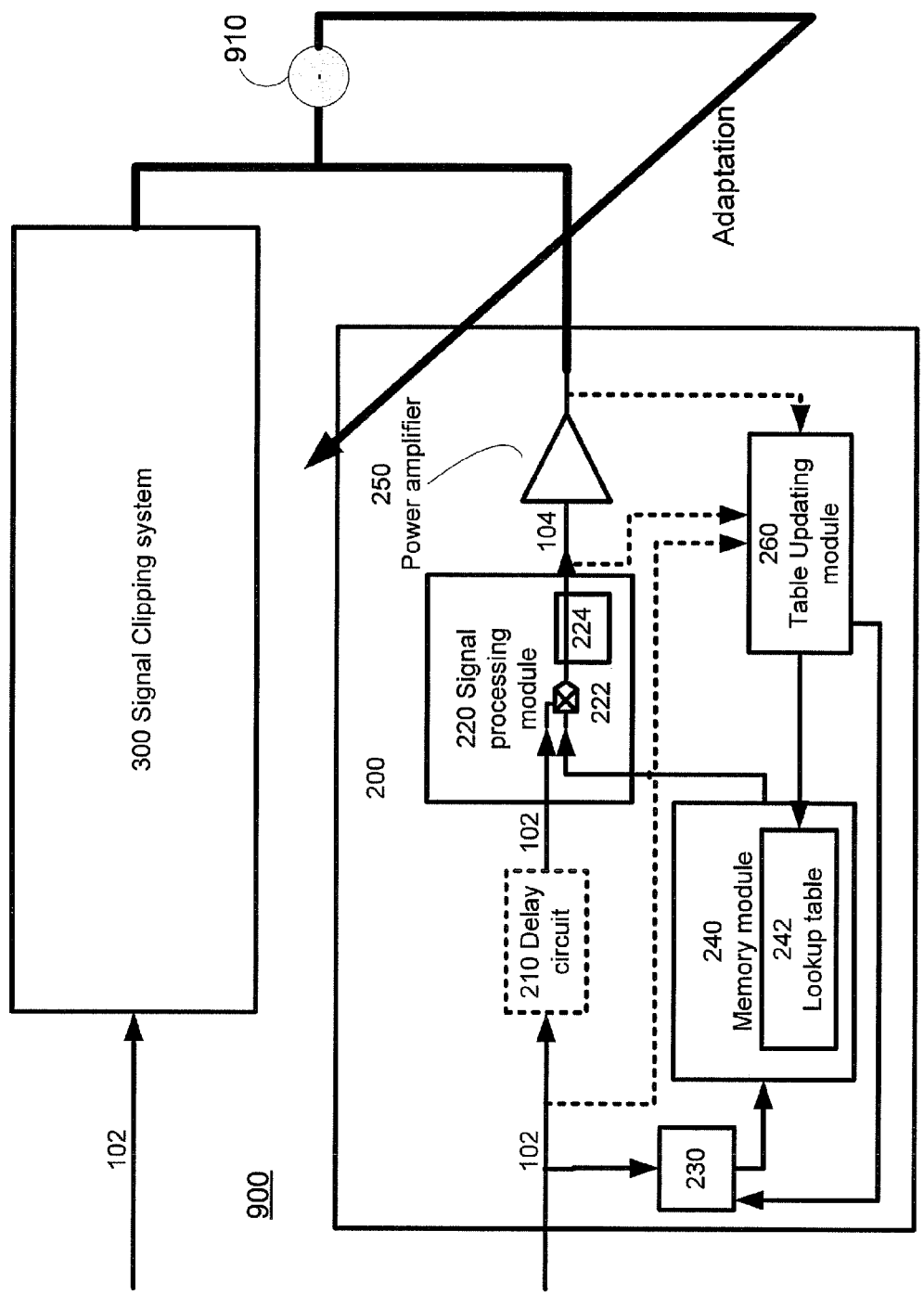
FIG. 5 illustrates a system, according to an embodiment of the invention.

FIG. 5 illustrates system 900, according to an embodiment of the invention. System 900 includes system 200, signal clipping system 300, and comparator 910. system 300 is a system that is capable of processing signals for clipping them. System 300 may be one of the prior art systems discussed in the background, but this is not necessarily so. System 900 may include means for providing input signal 102 to system 200 and to system 300 substantially concurrently (or at least at a known time difference which can be overcome later). Comparator 910 is adapted to compare the output signals of system 200 and of signal clipping system 300, and to provide comparison information. Table updating module 260 is configured to update at least one parameter of look-up table 242 in response to comparison information received from comparator 910. According to an embodiment of the invention, updating of the memory is done adaptively to minimize the Error using the calculation of a prior art system and our system. It is noted that at a later stage, the component of system 900 which is system 200 may be removed from the complex of system 900. According to an embodiment of the invention, parameters from a lookup table 242 of a first system 200 (e.g. the one included in system 900) may be copied (or use for the updating of) parameters of lookup table 242 of one or more second system 200 (e.g. not included in a system 900).

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A system for processing an input signal, the system comprising:
   a hardware memory module configured to store a lookup table that is least two-dimensional; and
   a signal processing module, configured to clip the input signal to provide a second signal that does not exceed a magnitude threshold, wherein the signal processing module is configured to clip the input signal by processing the input signal using at least one filtering parameter that is retrieved from the lookup table using at least a first and a second lookup table indexes; wherein the first lookup table index is responsive to a parameter of the input signal at a first moment, and the second lookup table index is responsive to the parameter of the input signal at a second moment that differs from the first moment.

2. The system according to claim 1, wherein the first lookup table index is responsive to a magnitude of the input signal at the first moment, and the second lookup table index is responsive to a magnitude of the input signal at the second moment.

3. The system according to claim 1, wherein the first lookup table index is responsive to a phase of the input signal at the first moment, and the second lookup table index is responsive to a phase of the input signal at the second moment.

4. The system according to claim 1, wherein the first lookup table index is responsive to an in-phase (I) component of the input signal at the first moment, and the second lookup table index is responsive to the I component of the input signal at the second moment.

5. The system according to claim 1, further comprising a table updating module, configured to update at least one filtering parameter of the lookup table in response to the second signal.

6. The system according to claim 1, wherein the first lookup table index is responsive to an quadrature (Q) component of the input signal at the first moment, and the second lookup table index is responsive to the Q component of the input signal at the second moment.

7. The system according to claim 1, further comprising a table updating module, configured to write to the lookup table at least one filtering parameter that is determined by minimizing a difference between a signal processed using the lookup table and a signal processed using another filter.

8. The system according to claim 1, wherein the signal processing module is configured to clip the input signal by processing the input signal using at least one filtering parameter that is retrieved from the lookup table using at least the first lookup table index, the second lookup table index and a third lookup table index; wherein the third lookup table index is responsive to the parameter of the input signal at a third moment that differs from the first and second moments.

9. The system according to claim 2, wherein the signal processing module is configured to process the input signal in response to at least one interpolated value that is determined in response to at least one filtering parameter and to at least one other filtering parameter, wherein the at least one other filtering parameter is retrieved from the lookup table using at least one lookup table index that is different from the first and the second lookup table indexes, and which is responsive to a magnitude of the input signal at one of the first and the second moments.

10. A method for processing an input signal, the method comprising:
selecting at least a first lookup table index and a second lookup table index in response to the input signal;
retrieving using at least the first lookup table index and the second lookup table index, at least one filtering parameter from a lookup table that is stored in a hardware memory module, using the at least one lookup table index;
clipping the input signal to provide a second signal that does not exceed a magnitude threshold, wherein the clipping comprises processing the input signal using the at least one filtering parameter;
wherein the first lookup table index is responsive to a parameter of the input signal at a first moment, and the second lookup table index is responsive to the parameter of the input signal at a second moment that differs from the first moment.

11. The method of claim 10, wherein the selecting comprises selecting the first lookup table index in response to a magnitude of the input signal at the first moment, and selecting the second lookup table index in response to a magnitude of the input signal at the second moment.

12. The method according to claim 10, comprising selecting the first lookup table index in response to a phase of the input signal at the first moment, and selecting the second lookup table index in response to a phase of the input signal at the second moment.

13. The method according to claim 10, comprising selecting the first lookup table index in response to an in-phase (I) component of the input signal at the first moment, and selecting the second lookup table index in response to an in-phase (I) component of the input signal at the second moment.

14. The method according to claim 10, further comprising updating at least one filtering parameter of the lookup table in response to the second signal.

15. The method according to claim 10, comprising selecting the first lookup table index in response to an quadrature (Q) component of the input signal at the first moment, and selecting the second lookup table index in response to a quadrature (Q) component of the input signal at the second moment.

16. The method according to claim 10, wherein the retrieving is preceded by determining at least one filtering parameter of the lookup table by minimizing a difference between a signal clipped using the lookup table and a signal clipped using another filter.

17. The method according to claim 11, wherein the selecting further comprises selecting a third lookup table index and wherein the retrieving comprises using at least the first lookup table index, the second lookup table index and the third lookup table index, to retrieve at least one filtering parameter from the lookup table; wherein the third lookup table index is responsive to the parameter of the input signal at a third moment that differs from the first and second moments.

18. The method according to claim 11, wherein the clipping comprises processing the input signal in response to at least one interpolated value that is determined in response to at least one filtering parameter and to at least one other filtering parameter; wherein the retrieving comprises retrieving the at least one other filtering parameter from the lookup table using at least one lookup table index that is different from the first and the second lookup table indexes, and which is responsive to a magnitude of the input signal at one of the first and the second moments.

19. The method according to claim 17 wherein the first, second and third moments are consecutive moments of a discrete sampling scheme.

20. The system according to claim 8 wherein the first, second and third moments are consecutive moments of a discrete sampling scheme.

* * * * *